US011616922B2

(12) United States Patent
Wojciechowski et al.

(10) Patent No.: US 11,616,922 B2
(45) Date of Patent: Mar. 28, 2023

(54) INTENSITY-NORMALIZED IMAGE SENSOR

(71) Applicant: Robert Bosch GmbH, Stuttgart (DE)

(72) Inventors: Ken Wojciechowski, Cupertino, CA (US); Pedram Lajevardi, Menlo Park, CA (US); Behnam Behroozpour, South San Francisco, CA (US); Kristine Juliane Back, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 269 days.

(21) Appl. No.: 16/772,448

(22) PCT Filed: Dec. 7, 2018

(86) PCT No.: PCT/EP2018/083992
§ 371 (c)(1),
(2) Date: Jun. 12, 2020

(87) PCT Pub. No.: WO2019/121070
PCT Pub. Date: Jun. 27, 2019

(65) Prior Publication Data
US 2021/0075982 A1    Mar. 11, 2021

Related U.S. Application Data

(60) Provisional application No. 62/608,759, filed on Dec. 21, 2017.

(51) Int. Cl.
*H04N 7/18*     (2006.01)
*H04N 5/353*    (2011.01)
(Continued)

(52) U.S. Cl.
CPC ..... *H04N 5/3537* (2013.01); *H01L 27/14605* (2013.01); *H01L 27/14645* (2013.01);
(Continued)

(58) Field of Classification Search
CPC ............ H04N 5/3537; H04N 5/35554; H04N 5/378; H04N 9/04559; H01L 27/14605;
(Continued)

(56) References Cited

U.S. PATENT DOCUMENTS 3,971,065 A    7/1976  Bayer
6,115,065 A    9/2000  Yadid-Pecht et al.
(Continued)

FOREIGN PATENT DOCUMENTS

WO      2013/104718 A2    7/2013

OTHER PUBLICATIONS

International Search Report corresponding to PCT Application No. PCT/EP2018/083992, dated Apr. 24, 2019 (6 pages).
Fossum, E. R., "CMOS Image Sensors: Electronic Camera-On-A-Chip," IEEE Transactions on Electric Devices, vol. 14, No. 10, 1997, 1689-1698 (10 pages).
(Continued)

*Primary Examiner* — Joseph G Ustaris
*Assistant Examiner* — Jimmy S Lee
(74) *Attorney, Agent, or Firm* — Maginot, Moore & Beck LLP

(57) ABSTRACT

An image sensor has a plurality of rows and columns of pixels, including RGB and bandpass I filters in a predetermined pattern shifted between adjacent columns so that none of the RGBI filters is adjacent the same type of filter. Each pixel includes a photodiode, a transfer gate and a floating diffusion. The transfer gate for all pixels in a pattern is controlled by the same signal, which can be a separate synchronous control signal controlled based on a predefined integration period or an asynchronous signal generated internally by the bandpass filter I and that is compared to a predefined voltage level indicative of a predetermined intensity at filter I. Upon activation of either signal, the integra-
(Continued)

tion period for the pixels ends and the charge on the floating diffusion for the R, G and B pixels is digitized in relation to the bandpass pixel I using a ratio-to-digital converter.

16 Claims, 1 Drawing Sheet

(51) Int. Cl.
*H04N 9/04* (2006.01)
*H01L 27/146* (2006.01)
*H04N 5/355* (2011.01)
*H04N 5/378* (2011.01)

(52) U.S. Cl.
CPC ......... *H04N 5/35554* (2013.01); *H04N 5/378* (2013.01); *H04N 9/04559* (2018.08)

(58) Field of Classification Search
CPC ............. H01L 27/14645; H01L 27/146; H01L 27/14685; H01L 27/14621
USPC ........................................................ 348/164
See application file for complete search history.

(56) References Cited

U.S. PATENT DOCUMENTS

| 9,741,761 B2* | 8/2017 | Jiang | H04N 5/369 |
| 2014/0009647 A1* | 1/2014 | Hayashi | H04N 9/07 |
| | | | 348/266 |

OTHER PUBLICATIONS

Omid-Zohoor, A. "Towards Always-On Mobile Object Detection: Energy vs. Performance Tradeoffs for Embedded HOG Feature Extraction," Stanford University, Mumnann Mixed-Signal Group, https://web.archive.org/web/20170915063312/https://web.stanford.edu/group/murmann_group/cgi-bin/mediawiki/index.php/Alex_Omid-Zohoor.

* cited by examiner

INTENSITY-NORMALIZED IMAGE SENSOR

PRIORITY CLAIM

This application is a 35 U.S.C. § 371 National Stage Application of PCT/EP2018/083992, filed on Dec. 7, 2018, which claims the benefit of U.S. Provisional Application No. 62/608,759, filed on Dec. 21, 2017, the entire disclosures of which are incorporated herein by reference.

BACKGROUND

One of the challenges in the design of image sensors is the large dynamic range that the sensors are called upon to handle. For example, the intensity of light in a dark environment versus the intensity under bright sunlight varies by eight orders of magnitude. This variation translates to 160 dB dynamic range in the amount of charge collected in a photodiode-based pixel with a constant integration time. The problem becomes accentuated when this large dynamic range must be supported by millions of pixels operating in parallel. Sophisticated electronic circuits capable of handling this dynamic range necessarily have a large on-chip footprint per pixel, which eliminates such circuits as a viable option in the design of image sensors.

One of the techniques developed in recent years to increase the effective dynamic range of image sensors is to use multiple (e.g., two) integration times per image capture. By choosing the duration of the integration intervals to be orders of magnitude different (e.g., 100 µs vs. 10 ms), the effective dynamic range of the imaging device can be artificially increased. However, capturing pixels with different brightness at different time intervals can cause deleterious secondary effects, such as motion bluffing when imaging a dynamic scene. There is a need in the field of image sensors to solve the dynamic range problem without these secondary setbacks.

The structure of a conventional RGB CMOS image sensor and its pixel architecture is shown FIG. 1. The chip area is patterned by the so called Bayer color filter, which is described in U.S. Pat. No. 3,971,065 to Bayer entitled "Color Imaging Array", the entire disclosure of which is incorporated herein by reference. As described in the '065 patent, in each row of the chip every other pixel is covered by a green optical filter and the remaining pixels alternate between red and blue optical filters for different rows. Underneath each mosaic there is a small electronic circuit that consists of a photosensitive part to convert the light to electric charge, and transistors for readout. One example of such an electronic circuit is disclosed in E. R. Fossum, "CMOS image sensors: electronic camera-on-a-chip," *IEEE Transactions on Electron Devices*, pp. 1689-1698, 1997, the entire disclosure of which is incorporated herein by reference. Every conversion cycle begins when a transfer gate $M_{TG}$ is set to an open state—i.e., no charge transfer from the photodiode PD. At this time the photodiode starts accumulating the photo-generated charge, or in other words, integrating the photocurrent on the junction capacitor. When, $M_{TG}$ is set to a closed state the accumulated charge is transferred to a floating diffusion (FD) $C_{FD}$. Setting $M_{TG}$ back to the open state marks the end of the integration period. Therefore, the total integration time in this case is the time interval between the two instances when the transfer gate $M_{TG}$ is opened. The voltage caused by the charge in the FD $C_{FD}$ is then buffered by a source follower $M_3$ and read out through a column bus. The voltage is then converted to a digital code to represent that particular pixel. After each readout the floating diffusion $C_{FD}$ is reset and ready for the next measurement. A similar procedure happens for every pixel. Parts of the circuitry can be shared among the pixels to reduce the required on-chip area for the circuits and improve the fill-factor of the photodiodes. For instance, an analog-to-digital converter (ADC) block (not shown in FIG. 1) is usually shared for the pixels in one column.

While this architecture works under normal lighting condition, it is not capable of providing the necessary dynamic range for capturing images in low light conditions, such as at night-time, or in bright daylight. With the fixed integration time of this architecture, the brightness of the light translates to photocurrent magnitude, and hence the amount of accumulated charge in a constant time window. In order to solve this problem multiple integration periods can be used to accumulate the charge, and then the result of the period with the most suitable level of charge can be quantized. This can be implemented by applying a proper timing signal to the transfer gate $M_{TG}$ that can mark the start and stop points of the integration periods as desired. For instance, in the case of dual integration time, the photodiode PD can be reset once 10 ms before readout, and once 100 µs before readout, as described in U.S. Pat. No. 6,115,065, the entire disclosure of which is incorporated herein by reference. Under the same light intensity, the amount of accumulated charge in these two time windows will be different by a factor of 100. The bright pixels that would saturate after 10 ms integration may not be saturated when integrated for 100 µs, and the dark pixels that would be buried in noise when integrated for 100 µs will have a larger value when integrated for 10 ms. This can relax the dynamic range requirements for the front-end as well as the ADC by 40 dB.

While this is an important improvement, it does come with some problems and limitations. Firstly, in order to capture a complete frame, all pixels should function twice and based on the intensity of light at each pixel the accumulated charge from the first or the second window is picked as its output. Hence, in the case of moving objects, this can cause bluffing in the image because different pixels might be captured at different time instants based on the intensity of light in their positions. Secondly, the light intensity can vary by 8 orders of magnitude or 160 dB, which is not easily achievable even when relaxed by a few tens of dB using the multi-integration-time technique. Theoretically, integration windows with larger difference, or even more integration windows, could be used to further relax the dynamic range, but this all would come at the cost of extra bluffing and other artifacts that could degrade the image quality.

SUMMARY OF THE DISCLOSURE

In one aspect of the present disclosure, an image sensor is provided with a plurality of rows and columns of pixels. Each pixel includes a corresponding filter, including RGB filters in a predetermined pattern. In addition, the corresponding filter of certain pixels includes an all-pass, or intensity, optical filter (I) by which the intensity of the optical signal received by the pixels can be ascertained. In one aspect, the filters for the pixels are provided in a pre-defined sequence, namely that in each column the pattern "RIG" (for red, all-pass and green filters), and "BIG" (for blue, all-pass and green filters) are alternated along the column. The pre-defined sequence of the two patterns is shifted between adjacent columns so that no particular type of the RGBI filters is adjacent the same type of filter.

In another feature of the present disclosure, each pixel of the image sensor includes a photodiode, a transfer gate and a floating diffusion. The transfer gate for all of the pixels in a pattern (RIG or BIG) are controlled by the same signal that can either be a separate synchronous control signal or an asynchronous signal generated internally by the all-pass filter I. The separate synchronous signal is controlled based on a predefined integration period, while the internally-generated asynchronous signal is compared to a predefined voltage level indicative of a pre-determined intensity at filter I. Upon activation of either signal, the integration period for the pixels ends and the charge on the floating diffusion for the R, G and B pixels is digitized in relation to the intensity pixel I using a ratio-to-digital converter. Optionally, the charge on the floating diffusion for the intensity pixel I can also be digitized to provide additional information regarding the optical signal detected by the sensor.

DETAILED DESCRIPTION

Figure 1:
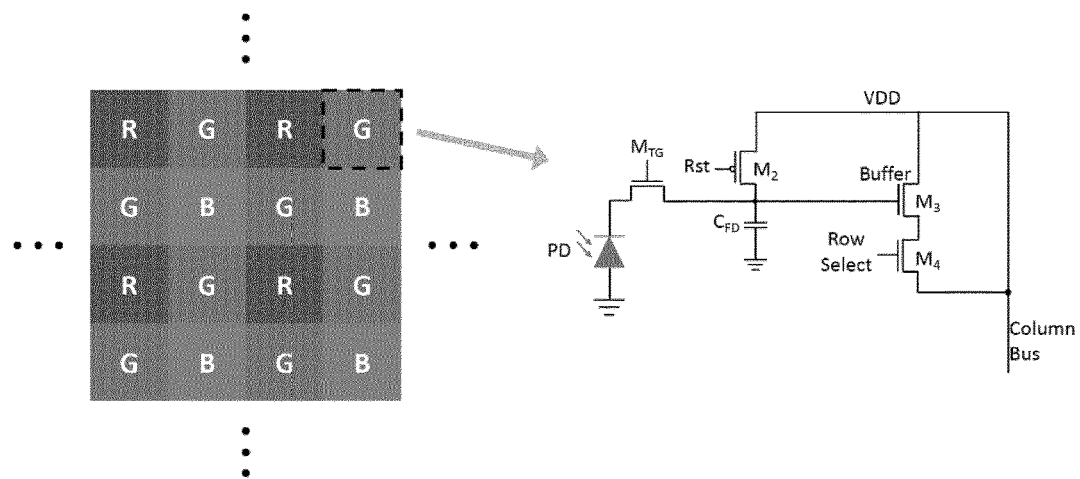
FIG. 1 is a schematic of a prior art CMOS image sensor structure and pixel architecture.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles disclosed herein as would normally occur to one skilled in the art to which this disclosure pertains.

The present disclosure provides a different approach to address the problems of the prior art image sensors discussed above. In most cases when there is a bright pixel, it is not necessarily useful to know the precise brightness of the pixel. Instead, it is useful to identify it as a bright pixel and to measure the RGB content of the light reaching that pixel. In particular, the sensors and methods described herein determine the ratio between the R, G and B content of the light. The image sensors described herein address the dynamic range issue by capping the total integration time for the bright pixels based on the level of accumulated charge in those pixels. With this approach, the dynamic range of the front-end electronics and the data converters do not need to be large, yet all the necessary information can still be captured from the scene.

Figures 2A, 2B:
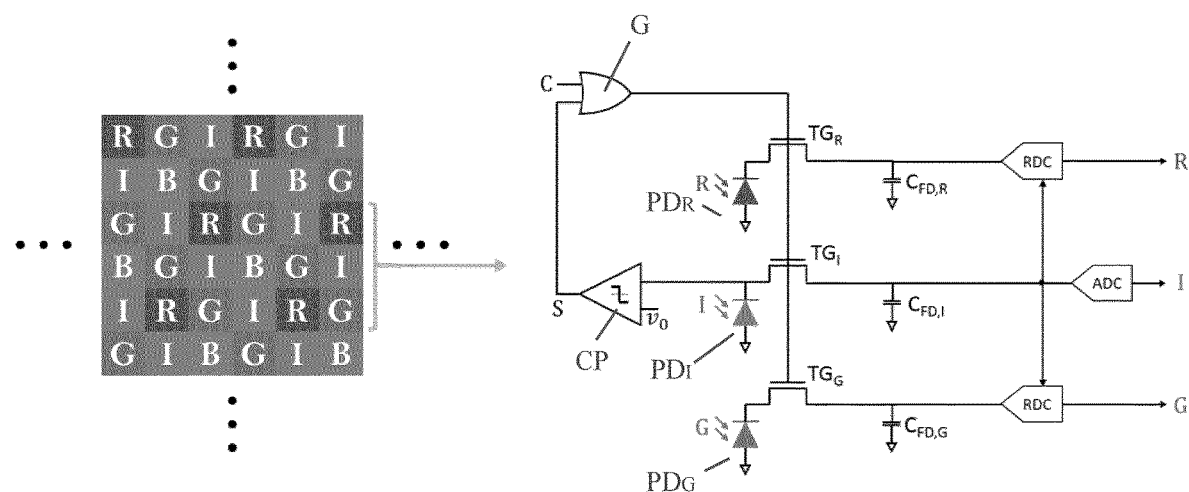
FIG. 2a is a diagram of pixel architecture according to one aspect of the present disclosure
FIG. 2b is a schematic of a CMOS image sensor and pixel architecture according to one aspect of the present disclosure.

An exemplary image sensor according to the present disclosure, with the corresponding pixel architecture, are shown in FIG. 2a, 2b. In addition to the traditional RGB filters, some of the pixels in this architecture are covered with a bandpass optical filter (or left blank), denoted by "I", which stands for Intensity. The bandwidth of the bandpass optical filter for these intensity pixels I is calibrated so that the intensity pixels will always receive more photons and accumulate more charge than the other (RGB) pixels since the intensity pixels are sensitive to a larger optical spectrum than the other pixels. The arrangement of the pixels, shown in FIG. 2a, is chosen so that when looking at each column, the patterns "RIG" and "BIG" are alternated or advanced by one pixel per column. In other words, the filters for the pixels are provided in a pre-defined sequence, namely that in each column the pattern "RIG" (for red, intensity and green filters), and "BIG" (for blue intensity and green filters) are alternated along the column. The pre-defined sequence of the two patterns is shifted between adjacent columns so that no particular type of the RGBI filters is adjacent the same type of RGBI filter. With this pre-defined sequence of patterns, the density of the green G and intensity I pixels is twice as much as the red R and blue B pixels in the array. The extra green pixels provide a finer spatial resolution in the green spectrum for which the human eye is the most sensitive. The extra density of the intensity pixels with all-pass optical filters allows the collection of more photons in the overall imager to improve its low-light sensitivity. The given pattern for distribution of the filters provides a uniform density for all filter types and enables easier and more reliable interpolation algorithms in post processing steps.

The circuit diagram for each of these three-pixel segments is similar. The circuit schematic of an "RIG" segment is shown in FIG. 2b as an example. Each pixel in the segment includes a photodiode $PD_x$, a transfer gate $TG_x$, and a floating diffusion $C_{FD,x}$, where "x" corresponds to R, I or G in the present example or to B, I and G for the "BIG" three-pixel segment. The transfer gates $TG_R$, $TG_I$, $TG_G$ of all pixels are controlled by the same signal that can be activated at "OR" gate G either by a synchronous control signal "C" or by an asynchronous signal "S" locally generated at the comparator CP. The control signal "C" can be clocked to the image sensor system.

In the beginning of a measurement time all pixels are reset by activating their corresponding transfer gates $TG_R$, $TG_I$, $TG_G$. Then the integration begins and continues until the transfer gates are activated again on the occurrence of one of two conditions. In the first condition, the pixel "I" saturates to a predefined level "$v_0$" generating the local flag or asynchronous signal "S" at comparator CP. In the second condition, if the intensity of pixel "I" is not high enough to lead to saturation, the integration continues until the end of the predefined integration period when the synchronous control signal "C" at gate G stops the integration. Once the integration is stopped, the charges on the floating diffusion $C_{FD,R}$, $C_{FD,G}$ of the pixels "R" and "G", respectively, are each digitized with reference to the charge in the "I" pixel by way of a ratio-to-digital converter (RDC) RDC. In other words, instead of using an external reference charge or voltage for analog-to-digital conversion, the charge from the "I" pixel can be used as a local reference. In particular, the ratios of the "R" and "G" charges to the charge of the intensity pixel "I" are provided as the digital values passed as the "R" and "G" values to the bus of the image sensor. As noted above, the signals R and G that are output from the circuitry of FIG. 2b are not absolute intensity values for the two colors red and green. Instead, the values are relative values or ratios by virtue of using the RDC for the digital conversion. The imaging device that receives these outputs R and G (as well as the outputs B and G from other patterns of sensors) can be configured and operable to use these color intensity ratios to generate a color image. After each conversion, the charge in the floating diffusion for each pixel from the previous measurement is reset to zero and another integration cycle begins until the voltage in the pixel "I" saturates and raises the local flag or the global asynchronous signal "S" stops the integration so that another digitization cycle follows.

In general terms, an RDC can be considered as an analog-to-digital converter (ADC) in which the reference signal for the conversion is not provided externally, but rather is generated locally. Details of an RDC used in image sensors are disclosed in "Towards Always-On Mobile Object Detection: Energy vs. Performance Tradeoffs for Embedded HOG Feature Extraction," A.Omid-Zohoor, Stanford University, available online at http://web.stanford.edu/group/murmann_group/cgi-bin/mediawiki/index.php/Alex_Omid-Zohoor, the entire disclosure of which is incorporated herein by reference. Further details of the structure and principles of operation of an RDC are found in "A Ratio-to-Digital Converter (RDC) with Time-Resolution Doubler for a Position Sensing System", Rashid et al., KEK Proceedings 93-8 (June 1993), *Radiation Detectors and Their Uses*, pp. 60-65, the entire disclosure of which is incorporated herein by reference; and in "Realization of the concept of the ratio-to-digital converter (RDC)", Matoba et al., *Nuclear Instr. and Methods in Physics Res*, Vol 224, Issue 1 (1984), p. 173-180, the entire disclosure of which is incorporated herein by reference.

The charge from the pixel "I" can optionally be digitized using a separate analog-to-digital converter ADC. Digitization of the charge from the "I" pixel may not be necessary in all image sensors if the end application does not use the intensity information and instead uses only color data. In certain cases, the mechanism used to stop the integration time (either charge saturation or reaching maximum time) can also be recorded to tag the pixels as "bright" or "normal". In particular, the asynchronous control signal "S" can be used as a flag that the intensity pixel "I" is bright. This can give extra information to the image or video processing software used for object or event recognition, or other image and video processing tasks.

The particular implementation of the architecture described above in relation to FIG. 2*b* can be technology dependent. In a conventional planar circuit technology it is usually preferred to keep the digitization circuitry outside the pixel area to maximize the fill factor. In these types of imagers the data-converters and other sophisticated circuits with large foot-prints are shared among neighboring pixels or among pixels from an entire column. In more advanced technologies where backside illumination or 3D integration is available, more circuits can be placed underneath the detector area which can help improve the performance by local (pre-) processing of the information within the pixels. These technologies are particularly useful for the image sensors contemplated in the present disclosure, since the ratio-to-digital converters RDCs can have an architecture as simple as a successive approximation register (SAR) converter which easily fits into a pixel area in the advanced technology nodes. The ADC for the intensity pixel can also be implemented locally (since only one ADC is needed per three pixels), or it can be shared among the pixels in one column, similar to the traditional imagers.

Other implementations of the image sensors disclosed herein can include different arrangements of the pixel segments and different circuit architectures. For instance, the RDC blocks can be time-multiplexed between "R" and "G" pixels (or between "B" and "G" for a BIG segment) to reduce the required circuit area. Other combinations of pixel filters, such as RGI or R I could be used as well. In a further alternative, the R, G and B outputs can be summed in the analog domain to create a composite "I" that is used to normalize the outputs (R, G and B).

With the particular implementation of the present disclosure, it is necessary to directly access the photodetectors in "I" regions to dynamically compare their accumulated charge to the reference saturation level. Considering the fabrication process of the imagers with pinned photodiodes, this might add some complications to the design. One embodiment to address these complications is to modify the manner in which the signal "S" is generated. In one specific embodiment, the control signal "C" continues transferring the charge from photodiodes at small time steps, for example 100 μs. Then the comparator can be connected to the floating diffusion $C_{FD,I}$ of the "I" pixel to determine if at any of these steps the transferred charge exceeds a predefined saturation limit, in which case the integration and charge transfer process is stopped. As long as the transferred charge of the "I" pixel is within the saturation limit, the integration and transfer steps continue until the overall integration time reaches a predefined limit, for instance 10 ms. Another advantage of this technique is that the number of the short accumulation periods that it takes for a bright pixel to reach the predefined saturation limit can be used as a measure of its intensity. For instance, a bright pixel that reaches the saturation limit in 2×100 μs is 5 times brighter than a pixel that reaches this limit in 10×100 μs.

In a further embodiment, rather than include the "I" all-pass optical filter in the filter pattern, the output of the "G" filter of an "RGB" pattern, similar to a conventional imager, can be used as the reference for digitizing the outputs of the "R" and "B" segments. It is understood that the amount of electric charge collected in a "G" segment may not necessarily be larger than the "R" and "B" segments, which can lead to a reduction in measurement precision. However, this embodiment may be well-suited for use with conventional CMOS imager technology, and therefore it could be attractive for applications where cost is of central importance The present disclosure should be considered as illustrative and not restrictive in character. It is understood that only certain embodiments have been presented and that all changes, modifications and further applications that come within the spirit of the disclosure are desired to be protected.

For example, in the illustrated embodiment, a predetermined pattern of pixels with red, green and blue filters or photodetectors are provided along with pixel I with an all-pass filter or photodetector that controls the duration of the integration cycle and/or provides the internal reference signal for the RDCs. Alternatively, the one or more pixels with specific N wavelength filters can be provided together with a "control" pixel I having a wider wavelength band filter than the one or more other pixels. The wavelength band of the "control" pixel I is calibrated to ensure that the "control" pixel collects more photons from a particular scene than any of the one or more other pixels, thus ensuring that the transfer gate $TG_I$ for the "control" pixel I collects more charge than the transfer gates for the other pixels. The other non-"control" pixels can have wavelength band filters, rather than filters at a discrete wavelength, provided that the spectrum of the non-"control" pixels is less than the spectrum detected by the "control" pixel I.

It is further understood that although the examples described herein refer to visible light spectrum for the filters, the filters can be calibrated to all light spectra, including infrared and ultraviolet. Thus, in certain applications all of the pixels and filters can be configured to detect wavelengths in the infrared or ultraviolet bands. In any case, the filter for the intensity pixel I must be in the same light spectrum as the other pixels (i.e., all in visible light, all in IR or all in UV), and the intensity pixel must configured to receive more light energy than any of the other filters. As discussed above, this can be accomplished by providing the intensity pixel filter with a wider bandwidth than the other filters.

What is claimed is:

1. An image sensor comprising:
a plurality of rows and columns of pixels, each pixel including a corresponding filter including a photodiode configured-to generate a signal in response to detecting one of red, green, blue or a frequency band of visible light incident on said pixel, said pixels including red (R), green (G), blue (B) and bandpass (I) filters, said bandpass (I) filters operable at the frequency band calibrated so that the associated pixel will accept more light than the pixels associated with the red, green or blue filters, said pixels arranged in a pre-defined sequence such that in each column a pattern RIG (for red, bandpass and green filters), and a pattern BIG (for blue, bandpass and green filters) are alternated along a given column and such that the pre-defined sequence of the RIG and BIG patterns is shifted between adjacent columns so that no particular type of the R,G,B and I filters is adjacent the same type of filter; and
electrical circuitry for detecting the signal generated by the corresponding filter of each pixel and generating a digital output signal for further video processing, said electrical circuitry including a transfer gate and a floating diffusion corresponding to each photodiode of the RIG pattern and the BIG pattern, the electrical circuitry configured and adapted to integrate the signal received from each photodiode in the pattern during an integration period as a charge accumulated in the corresponding floating diffusion, the transfer gate responsive to a control signal to permit or prevent the signal from the each photodiode passing to a corresponding floating diffusion,
wherein said control signal is an asynchronous signal generated by the bandpass filter (I) for a corresponding pixel in the pattern.

2. The image sensor of claim 1, wherein said electrical circuitry includes a comparator comparing the asynchronous signal generated by the bandpass filter (I) and a predefined voltage level indicative of a pre-determined intensity at filter (I), the comparator generating the control signal based on the comparison.

3. The image sensor of claim 2, wherein the asynchronous signal generated by the bandpass filter (I) is the accumulated charge of the transfer gate associated with the bandpass filter (I).

4. An image sensor comprising:
a plurality of rows and columns of pixels, each pixel including a corresponding filter including a photodiode configured-to generate a signal in response to detecting one of red, green, blue or a frequency band of visible light incident on said pixel, said pixels including red (R), green (G), blue (B) and bandpass (I) filters, said bandpass (I) filters operable at the frequency band calibrated so that the associated pixel will accept more light than the pixels associated with the red, green or blue filters, said pixels arranged in a pre-defined sequence such that in each column a pattern RIG (for red, bandpass and green filters), and a pattern BIG (for blue, bandpass and green filters) are alternated along a given column and such that the pre-defined sequence of the RIG and BIG patterns is shifted between adjacent columns so that no particular type of the R,G,B and I filters is adjacent the same type of filter; and
electrical circuitry for detecting the signal generated by the corresponding filter of each pixel and generating a digital output signal for further video processing, said electrical circuitry including a transfer gate and a floating diffusion corresponding to each photodiode of the RIG pattern and the BIG pattern, the electrical circuitry configured and adapted to integrate the signal received from each photodiode in the pattern during an integration period as a charge accumulated in the corresponding floating diffusion, the transfer gate responsive to a control signal to permit or prevent the signal from the each photodiode passing to a corresponding floating diffusion,
wherein the accumulated charge on the floating diffusion for each of the (R) and (G) pixels of all of the RIG patterns and each of the (B) and (G) pixels of all of the RIG patterns is digitized in relation to the bandpass pixel (I) using a ratio-to-digital converter to produce a digitized signal corresponding to the relative intensity of the (R), (B) and (G) pixels, said digitized signals combined to form the digital output signal for further video processing.

5. The image sensor of claim 4, wherein the accumulated charge on the floating diffusion for the bandpass pixel (I) for each of the RIG patterns and BIG patterns is digitized to provide a digitized signal corresponding to the intensity of the light received at said bandpass pixel to be combined with the digitized signals from the (R), (G) and (B) pixels to form the digital output signal for further video processing.

6. The image sensor of claim 5, wherein the accumulated charge on the floating diffusion for the bandpass pixel (I) is digitized by an analog-to-digital converter.

7. The image sensor of claim 1, wherein the bandpass filter for the bandpass pixel (I) is configured to pass all visible light frequencies.

8. An image sensor comprising:
at least one pixel including a corresponding photodiode adapted to generate a signal in response to detecting a predetermined frequency of light incident on said pixel;
at least one bandpass pixel distinct from said at least one pixel and including a corresponding bandpass photodiode adapted to generate a signal in response to detecting a predetermined frequency band of light incident on said control pixel, the frequency band calibrated so that the control pixel will accept more light than the each of the at least one pixel; and
electrical circuitry for detecting the signal generated by each corresponding photodiode of said at least one pixel and said at least one bandpass pixel and for generating a digital output signal for further video processing, said electrical circuitry including a transfer gate and a floating diffusion corresponding to each photodiode of said at least one pixel and said at least one bandpass pixel, the electrical circuitry configured and adapted to integrate the signal received from each photodiode during an integration period as a charge accumulated in the corresponding floating diffusion, the transfer gate responsive to a control signal to permit or prevent the signal from the each photodiode passing to a corresponding floating diffusion,
wherein said control signal is an asynchronous signal generated by the bandpass photodiode of one of the at least one bandpass pixel corresponding to the photodiode of one or more of said at least one pixel.

9. The image sensor of claim 8, wherein said control signal is an externally generated synchronous control signal provided at a predetermined interval to produce a predefined integration period.

10. The image sensor of claim 8, wherein said electrical circuitry includes a comparator comparing the asynchronous signal generated by the bandpass photodiode of one of the at least one bandpass pixel and a predefined voltage level indicative of a pre-determined intensity at the bandpass photodiode of said one of the at least one bandpass pixel, the comparator generating the control signal based on the comparison.

11. The image sensor of claim 10, wherein the asynchronous signal generated by the bandpass photodiode of said one of the at least one bandpass pixel is the accumulated charge of the transfer gate associated with the bandpass photodiode of said one of the at least one bandpass pixel.

12. An image sensor comprising:
at least one pixel including a corresponding photodiode adapted to generate a signal in response to detecting a predetermined frequency of light incident on said pixel;
at least one bandpass pixel distinct from said at least one pixel and including a corresponding bandpass photodiode adapted to generate a signal in response to detecting a predetermined frequency band of light incident on said control pixel, the frequency band calibrated so that the control pixel will accept more light than the each of the at least one pixel; and
electrical circuitry for detecting the signal generated by each corresponding photodiode of said at least one pixel and said at least one bandpass pixel and for generating a digital output signal for further video processing, said electrical circuitry including a transfer gate and a floating diffusion corresponding to each photodiode of said at least one pixel and said at least one bandpass pixel, the electrical circuitry configured and adapted to integrate the signal received from each photodiode during an integration period as a charge accumulated in the corresponding floating diffusion, the transfer gate responsive to a control signal to permit or prevent the signal from the each photodiode passing to a corresponding floating diffusion,
wherein the accumulated charge on the floating diffusion for one or more of said at least one pixel is digitized in relation to one of the at least one bandpass pixel using a ratio-to-digital converter to produce a digitized signal corresponding to the relative intensity of the one or more of said at least one pixel, said digitized signal of each of said one or more of said at least one pixel combined to form the digital output signal for further video processing.

13. The image sensor of claim 12, wherein the accumulated charge on the floating diffusion for said one of the at least one bandpass pixel is digitized to provide a digitized signal corresponding to the intensity of the light received at said one of the at least one bandpass pixel to be combined with the digitized signal of each of said one or more of said at least one pixel to form the digital output signal for further video processing.

14. The image sensor of claim 13, wherein the accumulated charge on the floating diffusion for said one of the at least one bandpass pixel is digitized by an analog-to-digital converter.

15. The image sensor of claim 8, wherein photodiode for the at least one pixel and the bandpass photodiode are all configured to detect light in the same visible, infrared or ultraviolet spectrum.

16. An image sensor comprising:
at least one pixel including a corresponding filter adapted to generate a signal in response to detecting a predetermined frequency of light incident on said pixel;
at least one bandpass pixel distinct from said at least one pixel and including a corresponding bandpass filter adapted to generate a signal in response to detecting a predetermined frequency band of light incident on said control pixel, the frequency band calibrated so that the at least one bandpass pixel will accept more light than the each of the at least one pixel; and
electrical circuitry for detecting the signal generated by the corresponding filter of each at least one pixel and each at least one bandpass pixel and for generating a digital output signal for further video processing, wherein the signal generated by at least one of said at least one pixel is digitized in relation to the signal generated by a corresponding one of the at least one bandpass pixel using a ratio-to-digital converter to produce a digitized signal corresponding to the relative intensity of at least one of the at least one pixel, said digitized signal for each of the at least one of said at least one pixel combined to form the digital output signal for further video processing.

* * * * *